United States Patent
van Deuren et al.

(10) Patent No.: US 7,885,021 B2
(45) Date of Patent: Feb. 8, 2011

(54) SIX DEGREE OF FREEDOM (DOF) ACTUATOR REACTION MASS

(75) Inventors: Frans H. van Deuren, Valkenswaard (NL); Hendrick Dirk Visser, Waalre (NL); Bernard Stommen, Geldrop (NL); Jeroen van Aert, Eindhoven (NL); Aart Johannes Mateboer, Al Waalre (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 380 days.

(21) Appl. No.: 12/057,130

(22) Filed: Mar. 27, 2008

(65) Prior Publication Data
US 2009/0040638 A1    Feb. 12, 2009

Related U.S. Application Data

(63) Continuation of application No. 11/718,132, filed as application No. PCT/IB2005/003116 on Oct. 18, 2005, now abandoned.

(60) Provisional application No. 60/622,660, filed on Oct. 27, 2004.

(51) Int. Cl.
*G02B 7/02* (2006.01)

(52) U.S. Cl. .................................................... 359/822

(58) Field of Classification Search .......... 359/811–830
See application file for complete search history.

(56) References Cited

U.S. PATENT DOCUMENTS

| 4,655,548 A | * | 4/1987 | Jue ............................. 348/373 |
| 6,036,162 A | | 3/2000 | Hayashi et al. |
| 6,327,024 B1 | | 12/2001 | Hayashi et al. |
| 6,449,030 B1 | | 9/2002 | Kwan et al. |
| 2002/0054280 A1 | | 5/2002 | Tokuda et al. |
| 2002/0149754 A1 | | 10/2002 | Auer et al. |
| 2003/0184724 A1 | | 10/2003 | Ono et al. |
| 2003/0197914 A1 | | 10/2003 | Cox et al. |
| 2004/0119964 A1 | | 6/2004 | Poon et al. |

FOREIGN PATENT DOCUMENTS

JP    2000003920    11/1999

OTHER PUBLICATIONS

PCT International Search Report for International Application No. PCT/IB2005/003116, dated Mar. 20, 2006.

* cited by examiner

*Primary Examiner*—Darryl J Collins
(74) *Attorney, Agent, or Firm*—Fish & Richardson P.C.

(57) ABSTRACT

In one embodiment, an actuator for positioning of mirrors in an optical system is provided and includes an actuator base and a reaction mass assembly. The reaction mass assembly includes a reaction mass support member having biasing features formed as a part thereof and a reaction mass that is coupled to the biasing features such that the reaction mass is suspended on biasing elements in six degrees of freedom (DOF). The support member is fixedly connected to the actuator base; however, the reaction mass is not directly attached to the actuator base but rather is supported in the reaction mass support member in a manner that allows it to have six DOF.

47 Claims, 6 Drawing Sheets

SIX DEGREE OF FREEDOM (DOF) ACTUATOR REACTION MASS

CLAIM FOR PRIORITY

This is a continuation application of U.S. patent application Ser. No. 11/718,132, filed Apr. 27, 2007 which is a U.S. National Phase application under 35 U.S.C. §371 of International Application No. PCT/IB2005/003116, filed Oct. 18, 2005 which application claims the benefit of priority under 35 U.S.C. § 119(e) to U.S. Provisional Application No. 60/622,660, filed Oct. 27, 2004, titled "A Six Degree of Freedom (DOF) Actuator Reaction Mass", all of which are hereby incorporated by reference in their entirety.

TECHNICAL FIELD

The present invention relates to an actuator for positioning mirrors in a setting, such as a projection lithography system, and more particularly, to an assembly that increases the performance of the actuator by filtering out disturbances generated by the surroundings.

BACKGROUND

In the manufacture of semiconductor devices, photolithography is often used. Projection optics are used to image a mask or reticle onto a wafer. Optical systems having a refractive group have achieved satisfactory resolutions operating with illumination sources having wavelengths of 248 or 193 nanometers. As the element or feature size of semiconductor devices becomes smaller, the need for optical projection systems capable of providing enhanced resolution are needed. In order to decrease the feature size which the optical projection systems used in photolithography can resolve, shorter wavelengths of electromagnetic radiation must be used to project the image of a reticle or mask onto a photosensitive substrate, such as a semiconductor wafer.

Because very few refractive optical materials are able to transmit significant electromagnetic radiation below a wavelength of 193 nanometers, it is necessary to reduce to a minimum or eliminate refractive elements in optical projection systems operating at wavelengths below 193 nanometers. However, the desire to resolve ever smaller features makes necessary optical projection systems that operate at the extreme ultraviolet wavelengths, below 200 nm; and therefore, as optical lithography extends into shorter wavelengths (e.g., extreme ultraviolet (EUV)), the requirements of the projection system become more difficult to satisfy.

In a typical arrangement, a projection optics box (POB) contains the optical components that are used to reduce the image and form it on the photosensitive substrate (wafer). In most projection optical systems, mirrors that are carefully crafted to perform the intended functions are used in combination with a number of lenses arranged relative thereto. The mirrors serve to redirect the light in the projection optic box as it passes therethrough from the mask to the photosensitive substrate. Typically, the POB includes an arrangement of mirrors and lenses that are constructed and positioned to accomplish the intended result.

Conventionally, the mirrors interface with actuators, which serve to move and position the mirrors within the POB. One of the issues that has to be confronted when using such actuators is that the actuators typically have a coil and magnet construction with the coil being the active part of the actuator and the magnet being the passive part of the actuator that is directly connected to the mirror. One technique that can be used to filter out disturbances generated by the surroundings is the use of a reaction mass that is directly connected to the actuator. In order to keep the mirror in accurate position, the actuator constantly has to generate a counteracting force to all disturbance forces working on the mirror. However, the conventional reaction mass arrangements have associated disadvantages in that their constructions do not entirely filter out all types of disturbances and more specifically, some of the arrangements are unable to filter out disturbances (parasitic forces) generated in certain directions relative to the reaction mass.

What has heretofore not been available is an improved reaction mass arrangement that offers improved filtering characteristics for filtering out forces that are generated in a variety of different directions.

SUMMARY

In one embodiment, an actuator for positioning of mirrors in an optical system is provided and includes an actuator base and a reaction mass assembly. The reaction mass assembly includes a reaction mass support member having biasing features formed as a part thereof and a reaction mass that is coupled to the biasing features such that the reaction mass is suspended on biasing elements in six degrees of freedom (DOF). The support member is fixedly connected to the actuator base; however, the reaction mass is not directly attached to the actuator base but rather is supported in the reaction mass support member in a manner that allows it to have six DOF.

In one embodiment, the reaction mass support member has a pair of opposing side walls that each has incorporated therein one of the biasing features in the form of a spring structure that is formed of six spring elements that allow movement of the spring structure in six directions (6 DOF). In other words, the reaction mass is coupled to base sections of the spring structures such that the reaction mass is suspended on the six spring elements in six degrees of freedom (DOF). Each of the base sections of the spring structures includes an opening for receiving a fastener that securely couples the reaction mass to the base sections such that movement of the reaction mass is translated into a force applied to the spring structures, whereby the spring elements act as filtering elements to ensure that the mirror remains in place.

In one preferred application as a reaction mass for a mirror actuator, the reaction mass is suspended on the spring elements to the surroundings ("world") and functions as a bi-directional low-pass filter. It prevents the transferal of the disturbances generated by the surroundings to the mirror and it also prevents the transferal of the disturbances generated by the mirror-actuator to the surroundings and any other mirror-actuators, and thus other mirrors within the same system.

Further aspects and features of the exemplary reaction mass and method for filtering disturbances can be appreciated from the appended Figures and accompanying written description.

BRIEF DESCRIPTION OF THE DRAWING FIGURES

DETAILED DESCRIPTION OF PREFERRED EMBODIMENTS

In a first step the invention is described in connection with FIGS. 7 through 14, wherein the basic principles are shown.

Figure 7:
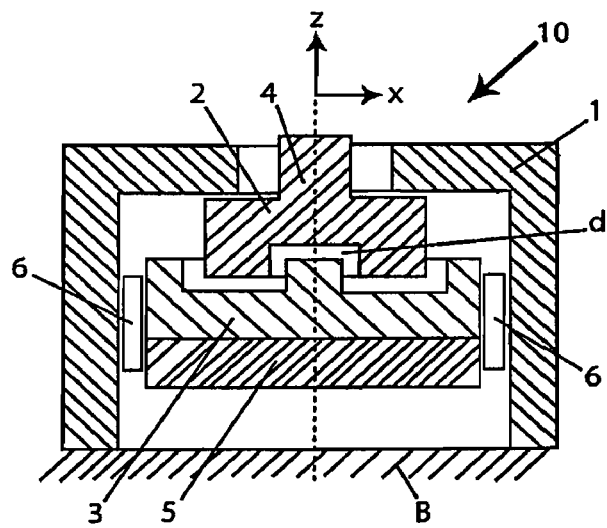
FIG. 7 is a schematic cross-sectional view of an actuator comprising a suspended actuation element, having 6 DOF.

FIG. 7 shows a schematic cross section of an actuator 10, preferably a precision positioning actuator 10 along a plane in z-direction which is e.g. the vertical direction. The actuator 10 is connected to a base B. The base B can be a part of a projection optical box (POB) of a projection lithography system used in e.g. extreme ultraviolet lithography (EUVL), or the base can be joined to the POB. However, the base B itself can be vibrationally decoupled from the POB to reduce the transfer of mechanical vibrations from the POB to the base B and vice versa. With the precision positioning actuator 10 a positioning of optical elements in the range of sub-nanometer up to about 50 nanometer is achievable.

The actuator 10 comprises an actuator base 1 connected to the base B. Additionally the connection between the base B and the actuator base 1 can be by damping means such that an additional vibrational decoupling between the base B and the actuator base 1 can be achieved. Alternatively, the connection can be a direct connection like a mechanical connection.

The actuator 10 further comprises a movable part 2 and a quasi-stationary part 3. The movable part 2 is connected to or associated with an optical element (not shown in FIG. 1). The optical element is preferably a mirror of a projection optical system used in EUVL. However, the optical element can be any element to be positioned with very high accuracy, meaning with accuracy in the nanometer or sub-nanometer range. The accuracy is usually better than 10 nm or even better than 1 nm. The connection of the movable part 2 of the actuator 10 to the optical element is usually by direct mechanical connection, using a connecting element 4. However, the connecting element 4 may comprise additional damping means such that the transfer of any vibrations or preferably, the transfer of a selected range of the frequency spectrum of the potential vibrations from or to the (optical) element may be reduced or can be prevented.

The quasi-stationary part 3 of the actuator 10 is arranged close to the movable part 2. Both parts 3 and 2 may overlap in certain areas, but the preferred relative arrangement of both parts 2 and 3 is such that the parts do not directly contact each other and are separated from each other by at least a distance d. If the actuator 10 is e.g. a Lorentz-actuator or a force-controlled actuator, the movable part 2 and the quasi-stationary part 3 are positioned relative to each other by magnetic forces such that the relive distance d of said parts in z-direction (or in general in the direction of the force) is controlled by a controllable magnetic filed. The movable part 2 and/or the quasi-stationary part 3 can be in the form of actuation means to be controlled e.g. by electrical current. The actuation means can be solenoids for generating magnetic fields and/or piezo elements to generate a change in length. A detailed description of a force-controlled actuator similar as the actuator 10 shown in FIG. 7 is given in applicant's U.S. patent application with Ser. No. 60/502,334, which is incorporated by reference by this citation. The movable part 2 of the actuator can be a bearing such that it is movable along the z-axis (actuation-axis) with very low friction. In a preferred embodiment, an actuator of the same type as shown in FIG. 7 is associated with at least an additional actuator, resulting in that the bearing of the movable part 2 of at least one of the actuators is such that there is actually no mechanical friction. This can be achieved by a magnetic bearing and the usage of e.g. at least two actuators 10 which are arranged in a bipod-structure. Such arrangement and embodiment are described in more detail in applicant's U.S. patent application with Ser. No. 60/502,334, which is incorporated by citation to be part of the present invention.

The quasi-stationary part 3 of the actuator 10 comprises a reaction mass 5. The reaction mass 5 may be directly connected to the quasi-stationary part 3, or the coupling can be by additional damping means (not shown) used for coupling and for damping such that vibrations from the reaction mass 5 are not fully transferred to the quasi-stationary part 3 or vice versa.

The reaction mass 5 is connected to the actuator base 1 via elastic bearing means 6, forming a reaction mass support member (also designated as 6 in FIG. 7), having biasing features formed as a part thereof. However, alternatively or in addition, the elastic bearing means 6 may also be connected to the quasi-stationary part 3 of the actuator 10, depending on how the quasi-stationary part 3 is connected to the reaction mass 5. In the case of direct (stiff) mechanical connection of the reaction mass 5 to the quasi-stationary part 3, there is almost no difference whether the elastic bearing means 6 is connected to the reaction mass 5 or the quasi-stationary part 3. In the case that additional damping means (not shown) are arranged between the reaction mass 5 and the quasi-stationary part 3, the connection of the elastic bearing means 6 will influence the overall vibrational behavior of the vibrational system, consisting of the reaction mass 5, the quasi-stationary part 3 and the elastic bearing means 6.

According to the present invention, the elastic bearing means 6 is formed such that within a certain range, the quasi-stationary part 3 of the actuator 10 is movable in 6 degrees of freedom (6 DOF). This can be achieved for example by a pair of leaf-springs arranged on apposite sides of the symmetry axis z, wherein the leaf-springs 6 comprise at least one pivot point within the spring, acting like a hinge. Preferably the pivot point or the hinge is an elastic joint, joining two leaf-springs or parts of them. The connections of the leaf-springs 6 (of the elastic bearing means 6) to the reaction mass 5 (or to the quasi-stationary part 3) and to the actuator base 1 (or the base B) serve for two additional pivot points. The bending of the spring parts around these pivot points allow the movement of the reaction mass into respective space directions, or give the freedom that the reaction mass 5 can be partially rotated around at least one axis in space, preferably around three axes. In the embodiment shown in FIG. 10, the elastic bearing means 6 is in the form of leaf-springs 6 with two pivot points 6a, 6b within the leaf spring 6. The leaf-spring 6 is arranged such that the elastic bearing means 6 comprises a vertical 6c and two horizontal leaf-spring elements 6d, 6e, wherein the horizontal leaf-spring elements 6d, 6e are directing in opposite directions, and are arranged in radial direction relative to the quasi-stationary part 3. Further, the spring 6 shown in FIG. 10 additionally has certain elasticity in a tangential direction, such that the reaction mass 5 may be able to rotate also around the z-axis within a certain angular range. In general the elastic bearing means 6 includes a first and second end, wherein the first end is connected to the actuator base 1 and/or the base B, and wherein the second end is connected to the reaction mass 5 and/or the quasi-stationary part 3. Further, the elastic bearing means 6 can be a flexure system to provide six degrees of freedom for the second end of the elastic bearing means 6. The flexure system may be leaf-springs as described above and as shown e.g. in FIG. 7 for a first embodiment of the invention. Further, it is important to point out that elastic bearing means 6 may suspend and/or support the quasi-stationary part 3 of the actuator 10. Preferably, the suspension and/or the support is formed by the flexure system. Additionally, it is preferred that the reaction mass 5 is also supported and/or suspended by the elastic bearing means 6.

Figure 8:
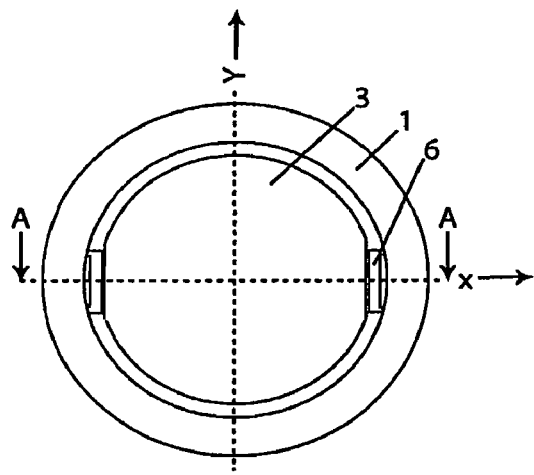
FIG. 8 is a schematic cross-sectional view of FIG. 7 along a cut-line A.

FIG. 8 shows a cross-sectional view of the actuator 10 along the A-A', wherein in FIG. 8 the same reference numerals are used for the same parts as in FIG. 7. In this embodiment, two elastic bearing means 6 are used to suspend the quasi-stationary part 3 together with the reaction mass 5. The elastic bearing means 6 is connected to the actuator base 1 with their first ends serving as a suspension means. Alternatively or in addition, the first ends of the elastic bearing means 6 may be connected to the base B for supporting the respective parts 5 and 3. The two elastic bearing means 6 are in a diametrically opposed arrangement and form a flexure system.

Figure 9:
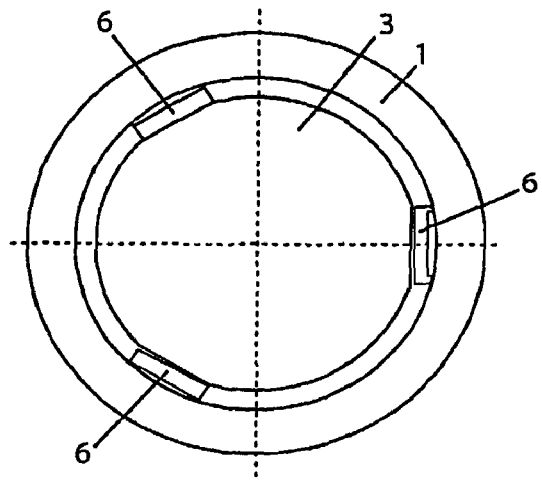
FIG. 9 is a schematic view of an alternative suspension of the suspended actuation element.
Figure 10:
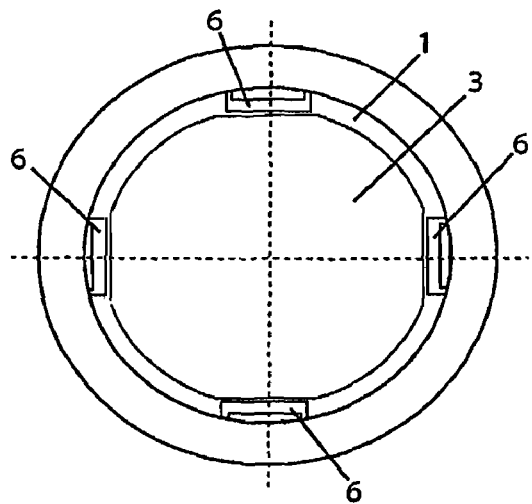
FIG. 10 is a further alternative suspension of the suspended actuation element.
Figure 11:
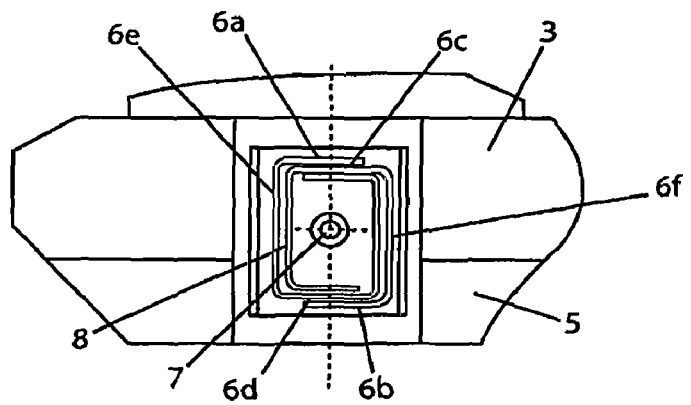
FIG. 11 is a simplified schematic cross-sectional view of the suspended actuation element.

FIGS. 9 and 10 show alternative arrangements of the elastic bearing means 6 relative to the quasi-stationary 3 (or the reaction mass 5) and the actuator base 1. In FIG. 9, three elastic bearing means 6 are arranged much that they enclose an angle of 120° between two adjacent elastic bearing means 6. In embodiment of FIG. 10, the angle is chosen 90°. In both embodiments, the elastic bearing means 6 are formed as leaf-springs as described in connection with FIG. 7. However, alternative leaf-spring arrangements may be used, as shown exemplarily in FIG. 11. In one embodiment, the elastic bearing means 6 includes a middle element 8 connected to the reaction mass 5 (or as an alternative to the quasi-stationary part 3) via a mechanical connection means 7 like a screw. The connection is such that the there is no relative movement of the middle element 8 and the reaction mass 5. The middle element 8 is extended by first leaf-spring parts 6c and 6d in about opposite directions until each part reaches a pivot point, where the first leaf-spring parts 6c, 6d are extended by respective second leaf-spring part 6f and 6e arranged under an angle to the respective first leaf-spring parts. Preferably, the angle is 90° and the second and first leaf-springs parts 6c to 6f are arranged in a plane. After a certain linear extension, the second leaf-spring parts 6e and 6f each reach a further pivot point. At these further pivot points, the second leaf-spring parts are extended by third leaf-spring parts 6a and 6b which are each connected to the actuator base 1 at opposite sides of the z-(symmetric) axis of the actuator 10. From the description and from FIG. 11, the elastic bearing means 6 can be in the form of a spiral-shape formed from a leaf-spring. Preferably the spiral is rectangular, and also preferably the bearing means 6 includes two spiral-shaped structures one turning clockwise, the other turning counter-clockwise. The inner parts of each spiral-structure are connected to a middle part 8 or alternatively direct to the reaction mass 5 (or the quasi-stationary part 3). The outer parts of the spiral-structure are connected to the actuator base 1 (or to the base B). Of course, spiral structures with more than three leaf-springs are possible for the clockwise or counter-clockwise structure. Preferably, the spiral-shaped structures are integrally or monolithically formed from one piece of material, comprising the spring elements and the pivot points as elastic joints or solid state hinges.

It should be mentioned that the elastic bearing means 6 according to the described embodiments of the invention also compensates the gravitational forces, or at least parts of them, resulting from the movable actuator parts 2 and 4, the reaction mass 5, the quasi-stationary part 3 and from the element which is adjusted by the actuator 10, the element is preferably an optical element 11 like a mirror.

Figure 12:
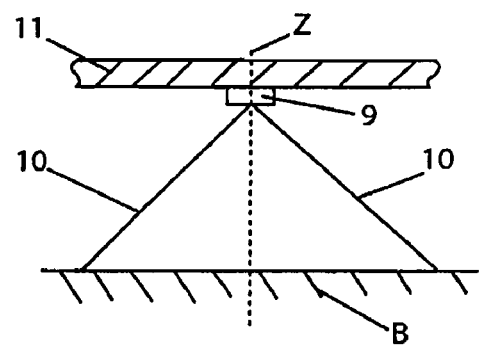
FIG. 12 shows schematically a bipod-arrangement of actuators each similar to the one shown in FIG. 7.
Figure 13:
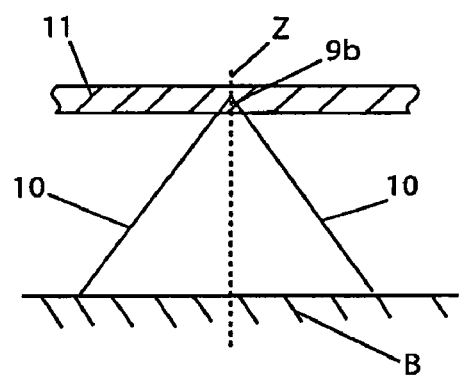
FIG. 13 shows schematically an alternative bipod-arrangement to FIG. 12.

FIG. 12 shows schematically a bipod-arrangement of two actuators 10 of the type as described in connection with FIGS. 7 to 11. The actuators 10 are only indicated by their respective symmetry axis. Both actuators are connected to a base B similar or equal as described in connection with FIG. 7. Further, the movable parts 2 of both actuators 10 are connected to a support member 9, for supporting the element (optical element) 11 which is adjusted by the actuators. Alternatively, the movable parts 2 of both actuators may be directly connected to the element 11 at a common point 9b. Other connections are also possible. For example, the connection of the two actuators 10 can be done in two different points (not shown) of the element 11. Important for the present invention is that the elastic bearing means 6 which form the reaction mass support and/or suspending member also comprise biasing features as a part thereof. The biasing features are such that the reaction mass 5 and/or the quasi-stationary part 3 is also supported and/or suspended if the axis of the actuator is not vertical but have an angle different from 90° relative to the base B. In FIGS. 12 and 13 the actuators 10 of the bipod-structure are preferably arranged under an angle of 40° to 60° relative to the base B. With such an arrangement of the actuators 10 the elastic bearing means 6 can still compensate the gravitational forces (as mentioned above) or at least parts of it.

Figure 14:
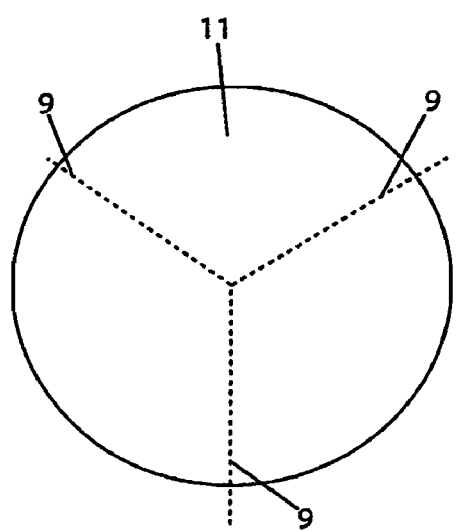
FIG. 14 shows schematically a hexapod-like arrangement of actuators according to the invention, supporting or suspending on optical elements.

FIG. 14 shows an element 11, preferably an optical element 11 like a mirror which is supported by three bipod-structures in the points 9, wherein each bipod-structure preferably comprises two actuators 10 with reaction masses 5 which are suspended or supported by the elastic bearing means 6, as described above. This arrangement of the actuators 10 has the advantage that the element 11 can be moved in 6 DOF (as described in applicant's U.S. patent application with Ser. No. 60/502,334) by independently controlling the 6 actuators 10 of the three bipod-actuator pairs. Since each actuator is in the form of the reaction mass 5 and the elastic bearing means 6 according to the present invention, the vibrations from the base B are damped with very high efficiency such that there is almost no influence to the element 11. Also, any vibrations from the element 11 are not transferred to the base B. This is important if base B supports additional elements which should not be influenced by vibrations.

In the following description, a specific embodiment of the present invention is described in more detail, showing additional advantages of the present invention. Further advantageous embodiments of the present invention can be achieved by combining and/or exchanging features of individual embodiments as a whole or in part.

Figure 1:
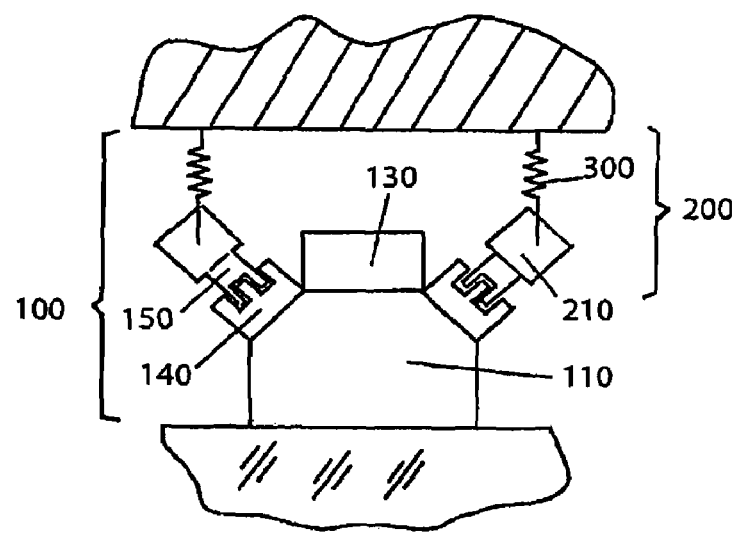
FIG. 1 is a side cross-sectional view of one exemplary mirror actuator.

FIG. 1 is a side cross-sectional view of one exemplary mirror actuator 100 that is particularly adapted to be used in a projection optic box (POB) (not shown) for moving and positioning mirrors within the projection optic box for e.g. an EUVL (extreme ultraviolet lithography) system. The mirror actuator 100 generally is formed of a first actuator base (support block) 110, a second actuator base (MGC) 130 that is coupled to the first actuator base 110, an actuator magnet core assembly 140 that is coupled to the first actuator base 110, an actuator coil assembly 150, and a reaction mass assembly, generally indicated at 200, that is coupled to the actuator coil assembly 150 and is formed of a reaction mass 210 and a weak spring member 300 that is coupled to the reaction mass 210. The spring member 300 is part of the reaction mass support member, having the biasing features and comprising the biasing elements.

As previously mentioned, the mirror actuator 100 acts as an interface with one of the mirrors that is contained within and forms a part of the POB. One exemplary mirror actuator 100 is a Lorentz type actuator that utilizes the Lorentz principle for actuation. Accordingly, the mirror actuator 100 is constructed and operates to position the mirrors within the POB during a photolithographic application. Additional details concerning the construction and operation of the actuator magnet core assembly 140 and the actuator coil assembly 150 can be found in commonly assigned U.S. patent application Ser. No. 10/704,534, entitled "Hermetically Sealed Elements of an Actuator", filed Nov. 6, 2003, which is hereby incorporated by reference in its entirety.

Since one part of the Lorentz mirror actuator 100, namely the actuator coil assembly 150, is coupled to the reaction mass 210, the mirror actuator 100 constantly has to generate a counteracting force to all disturbance forces that are applied onto the reaction mass 210 in order to keep the mirror in an accurate position. More specifically, if a force is applied onto the mirror by the mirror actuator 100, the equivalent counteracting force is applied onto the reaction mass 210. As a result, the reaction mass 210 is constantly moving (e.g., on a nanometer level) when the mirror is kept in position. However, it is preferable that the force generated to keep the mirror in place is filtered out by the weak spring member 300.

The reaction mass 210 is coupled to the mirror actuator 100 and is suspended on the weak spring member 300 to the surroundings ("world") and thereby functions as a bi-directional low pass filter. The reaction mass 210 prevents the transferal of the disturbances generated by the surroundings to the mirror and it also prevents the transferal of the disturbances generated by the mirror actuator 100 to the surroundings and the other mirror actuators 100 (and thus other mirrors within the same system).

Figure 2:
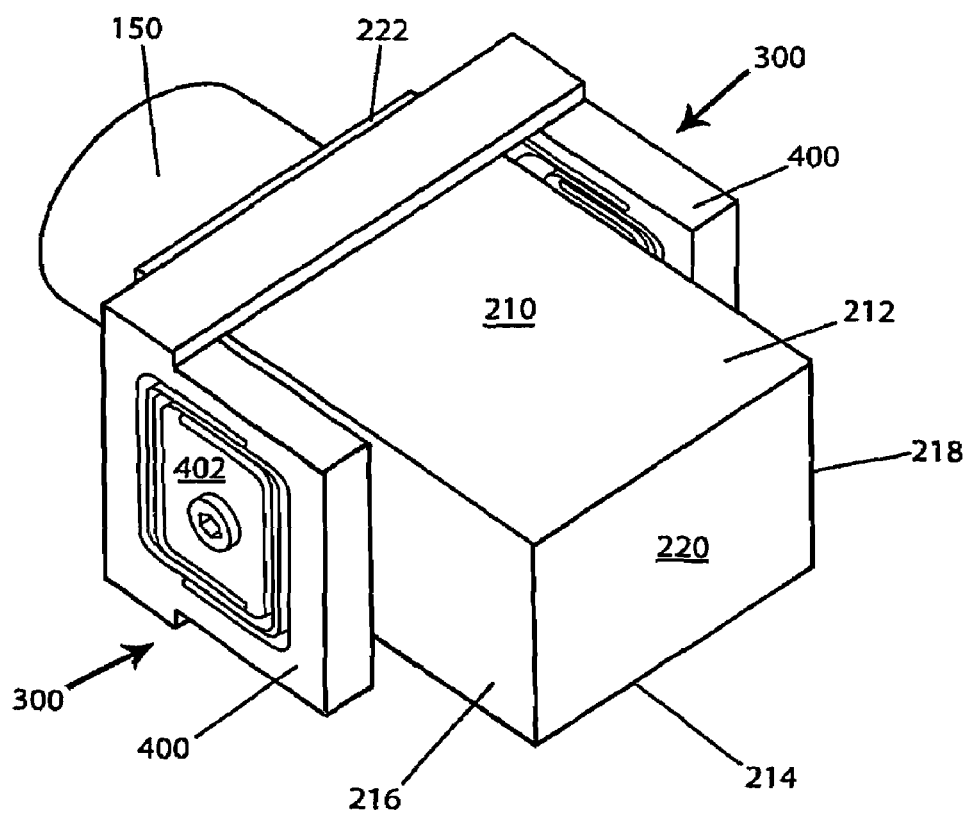
FIG. 2 is a perspective view of one reaction mass assembly including a coil and a 6 DOF weak spring component attached to the reaction mass.
Figure 3:
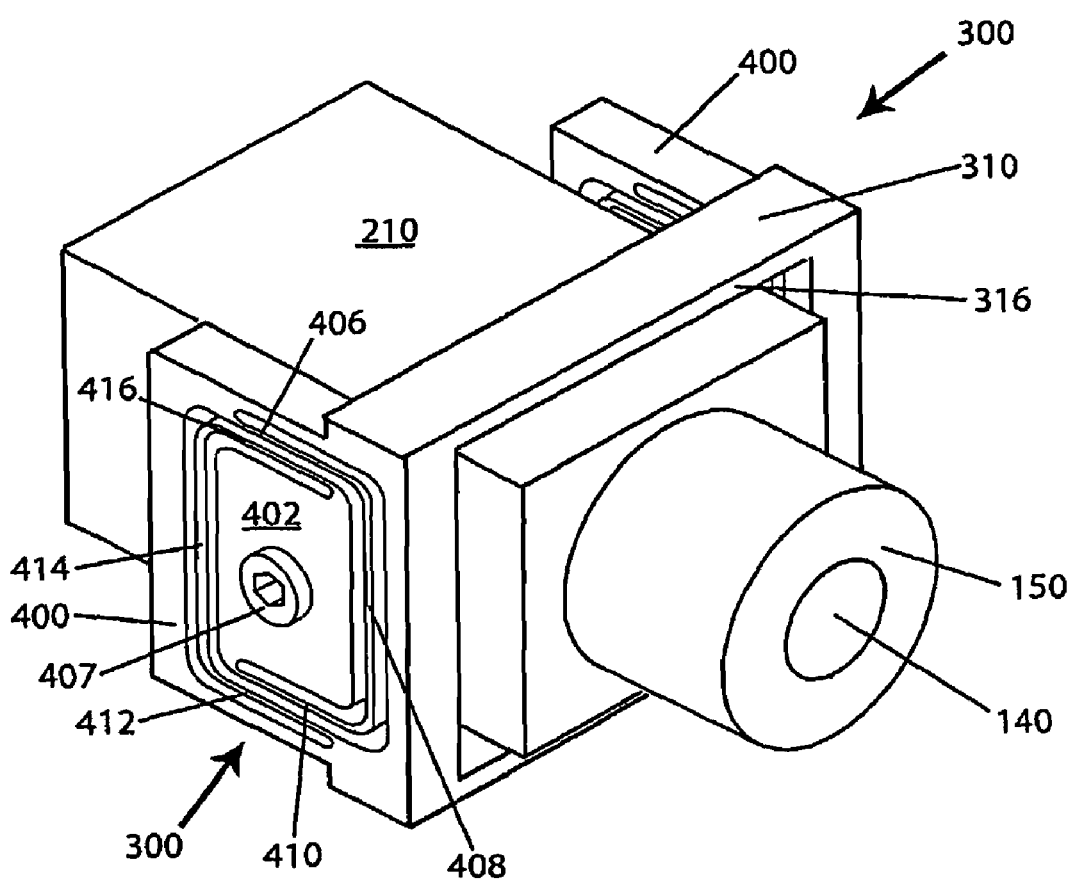
FIG. 3 is second perspective view of the reaction mass assembly of FIG. 2.
Figure 4:
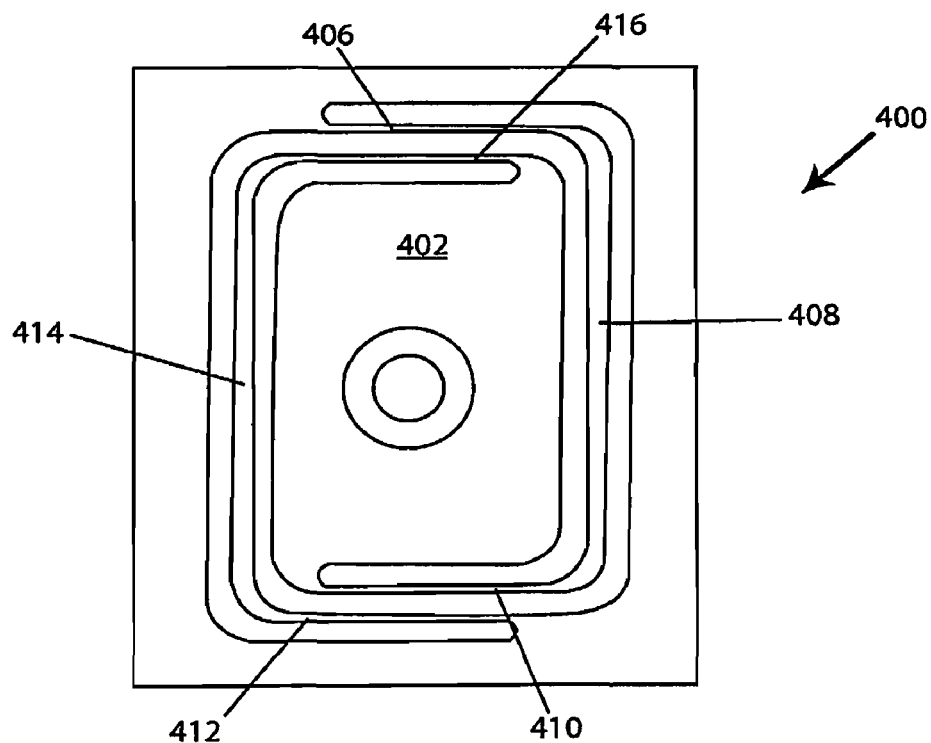
FIG. 4 is a side elevation view of one exemplary 6 DOF weak spring component in a relaxed position.
Figure 5:
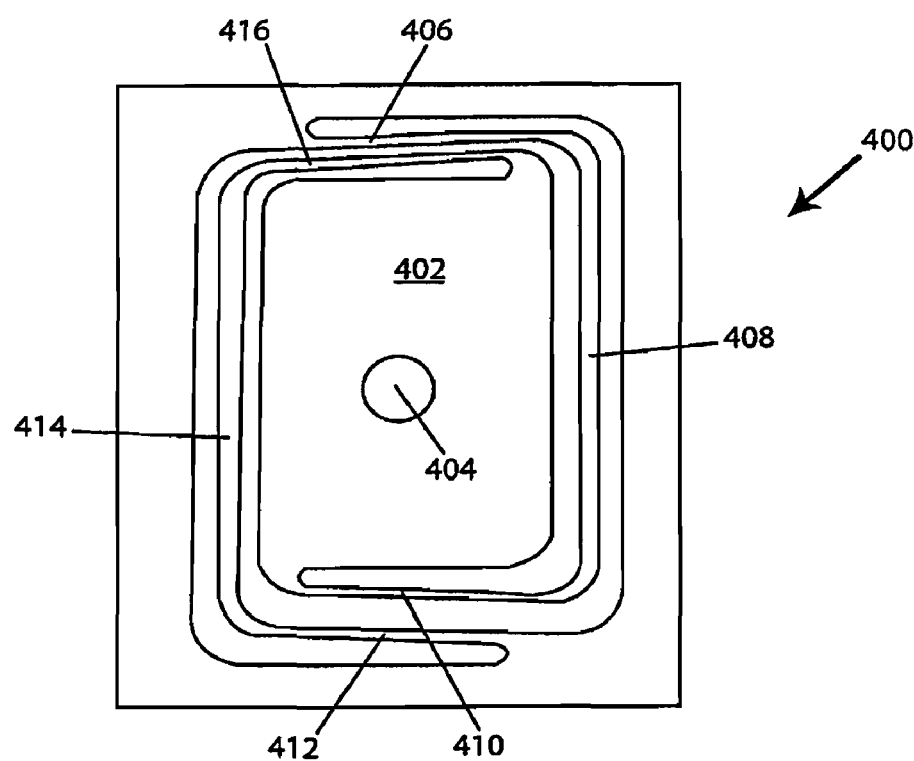
FIG. 5 is a side elevation view of the 6 DOF weak spring of FIG. 4 in a deflected position due to the application of gravitational forces.

FIGS. 2-3 present perspective views of one exemplary reaction mass 210 that forms a part of the reaction mass assembly 200. The reaction mass 210 is basically a solid formed structure and includes a first side face 212, an opposing second side face 214, a first end face 216, an opposing second end face 218, a bottom face 220 and an opposing top face 222. The first and second end faces 216, 218 can be mirror images of one another and include a number of features that facilitate the coupling between the reaction mass 210 and the weak spring member 300 such that the reaction mass 210 is suspended (or in general supported) by the weak spring member 300.

Each of the side faces 212, 214 can have formed as a part thereof, a groove or recessed channel or pathway formed from the top face 222 to the bottom face 220. The channel is recessed and serves as a pathway for receiving conductive leads (electric wires) of the actuator coil assembly 150.

The top face 222 is preferably a planar face that includes a bore that is formed in a center section of the top face 222. The reaction mass 210 is thus a mass that is suspended to the surrounding world only by the weak spring member 300 and a number of features formed as a part thereof are for coupling the reaction mass 210 to surrounding components.

Figure 6:
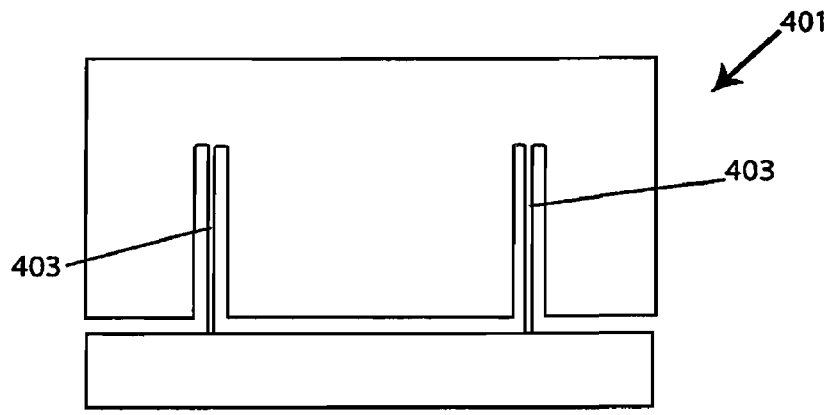
FIG. 6 is a side elevation view of one exemplary 1 DOF weak spring component in a relaxed position.

As best shown in FIGS. 2-5, the weak spring member 300 is constructed depending upon the desired degree of freedom (DOF) and therefore, the weak spring member 300 can have different types of degree of freedom. For example, one weak spring arrangement is of a 1 DOF design as illustrated in FIG. 6, while another weak spring arrangement is a 6 DOF design illustrated in FIGS. 1-5.

As is known, DOF stands for degree of freedom and it is used to describe not only movement along the linear axis X, Y, and Z but it is also used to describe rotational movement about the linear axis, $R_x$, $R_y$, $R_z$. The rotational axis is defined as being perpendicular to the respective linear axis.

In the 6 DOF design, the weak spring member 300 includes a pair of opposing weak springs 400 that deform in various directions as various loads are applied to each spring 400 and depending upon the direction of the load. One exemplary weak spring 400 is generally rectangular in shape and includes an inner base section 402 that serves as the attachment point between the weak spring member 300 and the reaction mass 210. The illustrated inner base section 402 has a generally rectangular shape and has an opening 404 formed therethrough for receiving a member that couples the weak spring member 300 to the reaction mass 210. The spring 400 is constructed so that the center plane (base section 402) is connected to the outside world by six springs in total, namely a first spring 406, a second spring 408, a third spring 410, a fourth spring 412, a fifth spring 414, and a sixth spring 416. For each spring, lengthwise the stiffness of the spring is high but for forces perpendicular to that direction of the spring, the spring is weak. However, when all six springs are combined, the springs are weak in all six directions (the three linear directions and the three rotational directions). The 6 DOF weak spring arrangement can be thought of as including four double hooked leaf springs that provide the six weak spring directions, thereby providing the 6 DOF. Similar to the 1 DOF design, the hooked leaf springs are designed to be in their nominal operating position with the effect of gravity taken into account. A beneficial aspect of this design is that the chosen materials for weak springs 400 and the reaction mass 210 can be different.

The movement of the base section 402 is dependent upon the movement of the reaction mass 210 since the weak springs 400 are coupled to the reaction mass 210 and as a force is applied to the reaction mass 210, the force is translated into a force on the weak springs 400 causing deformation of one or more of the six springs depending upon the direction and magnitude of the applied force. In other words, the center of each of the weak springs 400 is determined by movement of the reaction mass 210. As will be described in more detail hereinafter, one part of the Lorentz actuator 100 is connected to the reaction mass 210 and therefore to keep the mirror in accurate position, the actuator 100 constantly has to generate a counteracting force to all disturbance force working on the mirror. If a force is applied onto the mirror by the Lorentz actuator, the equivalent counteracting force is applied onto the reaction mass 210. Therefore, the reaction mass 210 is constantly moving (e.g., on a nanometer level) when the mirror is kept in position. The force generated to keep the mirror in place is filtered out by the springs 406-416.

The base section 402 of the weak spring 400 includes a plurality of openings formed therethrough. More specifically, the base section 402 has a mounting opening 404 formed therethrough in the center section thereof to receive a central fastener 407 (e.g., a tightening screw) that couples the reaction mass 210 directly to the base section 402 by extending through the centermost opening formed in the reaction mass 210. More specifically, the reaction mass 210 is coupled the weak springs 400 at the first and second end faces 216, 218 thereof; however, it can be any other surfaces. By means of this connection, the reaction mass 210 is suspended within the weak spring arrangement 300; however, it will be appreciated that this type of connection permits the reaction mass 210 to move in 6 DOF as forces are applied thereto. On each side of the main opening 405, the base section 402 preferably has other openings formed therethrough and receive dowel pins or the like which are aligned with the two other openings for the purpose of preventing the reaction mass 210 from rotating around the center fastener 407.

The weak spring member (arrangement) 300 not only includes the weak springs 400 but it also includes a mounting structure 310 that surrounds the reaction mass 210 and permits the weak spring member 300 to be connected to another member, such as the actuator base 110. More specifically, the mounting structure 310 acts as a cage-like structure that surrounds and suspends the reaction mass 210. The mounting structure 310 is formed of two opposing side walls and a base section 316 that can be completely closed and extends around the reaction mass 210. Preferably, the side walls and base section 316 are an integral structure with the base section 316 providing an interface between the mounting structure 310 and the actuator base 110. In the exemplary embodiment, the base section 316 is generally square shaped so as to complement the square shape of the reaction mass 210 since the base section 316 extends around the outer periphery of the reaction mass 210 with only a slight gap being formed between the base section 316 and the reaction mass 210 to permit some movement of the reaction mass 210. The base section 316 can be defined in part by one end of each of the side walls 212, 214 and by opposing sections that travel along the first end face 216 and the opposing second end face 218 of the reaction mass 210. When the weak spring member 300 is coupled to the reaction mass 210, the conductive leads of the coil assembly 150 can be fed through the channel underneath the section of the base section 316. When the reaction mass 210 is coupled to the mounting structure 310, the base section 316 is disposed at the top face 220 of the reaction mass 210 with the opposite bottom face 222 of the reaction mass 210 being disposed proximate the opposite end of the mounting structure 310.

The side walls of the mounting structure 310 actually incorporate the weak springs 400 in the design thereof. As can be seen in the figures, the side walls can each have an ear structure (curved portion) at the end thereof which is opposite the base section 316. When the reaction mass 210 is coupled to the mounting structure 310, the bottom face 222 of the reaction mass 210 does not extend beyond the ears and therefore the conductive leads that are led through the channel also preferably pass through small openings formed in at least one of the ears. The ears are thus present to partly protect the conductive leads during assembly of the mirror module/projection optic box. The formation of ears reduce the chances that someone could accidentally hook or otherwise entangle and pull the conductive leads.

Each of the side walls can have formed as a part thereof, an overload section to which an overload plate is attached. The exemplary overload plate is a substantially flat plate that is configured to fit within the boundaries of the side walls of the mounting structure 310 when it is coupled to the mounting structure 310 above the ears thereof. The overload plate has a plurality of openings including a pair of innermost openings that receive fasteners, such as screws, for fixing the overload protection, which in this case is the overload plate. The overload plate protects the weak springs 400 from too large a deflection during a crash or other emergency situations due to the free stroke of the reaction mass 210 being limited by the overload plate. The other openings (the outermost openings) are designed to receive overload pins or the like which serve to fix the overload protection (plate).

The base section 316 is constructed to act as an interface with the actuator base 110 such that the weak spring member 300 is fixedly attached to the actuator base 110. However, the manufacturing tolerances of the supporting weak springs of the reaction mass 210 cannot be controlled in such a way that all manufactured springs are constructed and behave exactly the same (considering the stiffness). This means that, when assembling the actuator 100, the intended operating position of the reaction mass 210 cannot be attained within the allowable tolerance-range. For this reason, an adjustable interface (interfacing) between the supporting weak springs of the reaction mass 210 and the base 110 of the actuator 100 is provided.

The adjustable interface is formed of six spacers that together define the position of the reaction mass 210 in the 6 DOF. In one exemplary embodiment, each spacer is a pin with one end being spherically shaped and the other end having a flat surface. During the assembly-phase of the actuator 100 for each of the six DOF, the deviation between the desired position and the actual position of the reaction mass 210 is measured, using nominal size spacers. From this deviation, the actual size of the six spacers can be calculated. After the calculation, the nominal spacers are exchanged with spacers that have the appropriate size. After exchanging the nominal spacers, the position of the reaction mass 210 is within the allowable tolerance-range for its operating position.

As will be described in greater detail hereinafter, when the weak spring member 300 is securely attached to the actuator base 110, the magnet core assembly 140 and the actuator coil assembly 150 are placed in close proximity to one another to permit the coil assembly 150 to selectively and controllably influence the magnet core assembly 140. In fact, the coil assembly 150 is at least substantially disposed within the cavity when the weak spring member 300 is coupled to the actuator base 110. The arrangement of the coil assembly 150 relative to the magnet core assembly 140 and the operative movements thereof are described in more detail in the previously incorporated Ser. No. 10/704,534 patent application.

The design of the 6 DOF weak spring member 300 has the aforementioned filter function in all 6 DOFs and it also significantly reduces the parasitic moments and forces, introduced by misalignments between the active part of the actuator 100 (coil assembly 150) and the passive part (the magnet assembly 140), the center of gravity of the reaction mass 210 and the thermal center of the active part which are transferred to the mirror and the world during the manipulation of the mirror). The 6 DOF filtering function increases the overall performance of the actuation system.

The reaction mass 210 is located between the actuator 100 and the world. The active part of the actuator 100 is directly connected to the reaction mass 210 and the passive part of the actuator is directly connected to the mirror, with the active and passive parts having no direct physical connection. Among other benefits, this selection of the actuator layout prevents direct conductance of heat generated by the coil assembly 150 to the mirror and thus significantly reduces the thermal expansion of the surface figure deformation (SFD) of the mirror. Another important benefit is that no wires (conductive leads) (leading to and from the coil assembly 150) are directly connected to the mirror and thus no disturbances from the surroundings can be transferred to the mirror via these wires.

Due to the large free movement range of the reaction mass 210, collisions can occur between the active and passive parts of the actuator 100. Since the passive part is directly connected to the mirror, these impacts can damage the mirror. A collision protection can be been devised to safeguard the mirror from impacts. The passive part of the actuator 100 (the permanent magnet) is, thermally, directly connected to the mirror and the active part of the actuator 100 is directly connected to the reaction mass 210 and therefore, the active and passive parts do not have a direct physical connection. The advantage is that heat from the active part of the actuator is conducted to the reaction mass 210 and via the supporting weak springs 400 of the reaction mass 210 to the world. Since any heat transferred to the mirror will give rise to SFD of the mirror, this is a desirable feature. However, this choice does not prevent direct radiation of heat to the mirror. As a beneficial feature however the reaction mass 210 has a large surface area that is not aimed at the mirror but at the surrounding space. The heat that is generated inside the coil (during manipulation of the mirror) can be transferred to the projection optic box via radiation from the surface-area on the reaction mass 210.

As illustrated in FIG. 6, in the 1 DOF design, only the actuation direction of the reaction mass 210 is connected to the world via a weak spring 401. All other directions are connected via stiff springs to the world. This is done by providing the two parallel leaf springs 403 that form a near linear guide. The (weak) stiffness of the leaf springs in the guiding direction are defined by the dimensions of the leaf springs and the material properties. The leaf springs 403 are designed in such away that the nominal position of the leaf springs 403 is achieved with the effect of gravity taken into account (the springs bend away from their nominal positions due to the influence of gravity on the reaction mass 210 and this is corrected for). The nominal position of the springs 403 when no external forces and moments are present does not coincide with the nominal mid-position of the actuator-stroke when gravity acts on the reaction mass 210.

The decoupling frequency of the reaction mass 210 that has to be achieved is determined by the mass of the reaction mass 210 and the stiffness of the supporting springs 406-416 of the reaction mass 210 to the world. In order to gain a significant reduction of the volume needed to realize a suitable reaction mass 210, a material with a high density is needed. One particularly suitable material is a tungsten alloy that is commercially available under the trade name DENSIMET from Plansee located in Austria. DENSIMET is readily available and is relatively inexpensive when compared to other high-density materials, such as tungsten, gold, platinum, uranium, which likewise can be used to form the reaction mass 210. DENSIMET is also relatively easily machinable and it has not safety/hazard issues, it can be used in a vacuum and is non-magnetic. This last property is essential because it prevents any disturbing interaction with the Lorentz actuator 100 and the magnetic gravity compensator. However, it will be appreciated that other materials can be used to form the reaction mass 210.

The present reaction mass assembly 200 offers an improved construction and arrangement that provides improved filtering out of forces that are generated in a number of different directions (e.g., 6 DOF), thereby increasing the overall performance of the actuation system, such as decoupling of disturbance forces and increasing control bandwidth.

It will be appreciated by persons skilled in the art that the present invention is not limited to the embodiments described thus far with reference to the accompanying drawings; rather the present invention is limited only by the following claims.

What is claimed is:

1. An actuator for positioning of optical elements like mirrors in an optical system comprising:
   an actuator base;
   a reaction mass assembly including a reaction mass support member having biasing features formed as a part thereof and a reaction mass that is coupled to the biasing features such that the reaction mass is suspended on the biasing features in six degrees of freedom (DOF), the support member being adapted to be fixedly connected to the actuator base; and
   an actuator coil assembly that is securely coupled to the reaction mass.

2. The actuator of claim 1, further including:
   an actuator magnet core member coupled to the optical element like the mirror and associated to the actuator base by a bearing such that when the support member is fixedly connected to the actuator base, the actuator coil assembly is disposed such that an active part of the coil assembly is disposed at least partially within a housing of the actuator magnet core member.

3. An actuator for positioning of optical elements like mirrors in an optical system comprising:
   an actuator base;
   a reaction mass assembly including a reaction mass support member having biasing features formed as a part thereof and a reaction mass that is coupled to the biasing features such that the reaction mass is suspended on the biasing features in six degrees of freedom (DOF),
   wherein the support member is adapted to be fixedly connected to the actuator base, and
   wherein the reaction mass support member has a pair of opposing side walls that each has incorporated therein one of the biasing features in the form of a spring structure that is formed of six spring elements that allow movement of the spring structure in six degrees of freedom and the reaction mass is coupled to base sections of the spring elements such that the reaction mass is suspended on the six spring elements in six degrees of freedom (DOF).

4. The actuator of claim 3, wherein each of the base sections of the spring elements includes an opening for receiving a fastener that securely couples the reaction mass to the base sections such that movement of the reaction mass is translated into a force applied to the spring elements, whereby the spring elements act as filtering elements to ensure that the mirror remains in place.

5. The actuator of claim 4, wherein each base section of the associated spring structure includes at least one opening formed therethrough to receive a member which prevents rotation of the reaction mass about the fastener that couples the reaction mass to one side wall.

6. The actuator of claim 5, wherein there are two openings formed in each base section for receiving two dowel pins that prevent rotation of the reaction mass about the fastener which is disposed between the two dowel pins.

7. The actuator of claim 3, wherein each side wall also includes an overload protection mechanism to protect the spring element from an excessive deflection during an event by limiting a free stroke of the reaction mass by the overload protection mechanism.

8. The actuator of claim 7, wherein the overload protection mechanism includes an overload protection plate that is mounted to one of the side walls in a location below one respective spring structure.

9. The actuator of claim 3, wherein each spring structure is formed of four double hooked leaf springs that define the six spring elements and provides six weak spring directions.

10. The actuator of claim 3, wherein the reaction mass support member has an end body section that is defined in part by ends of the side walls and extends around an outer periphery of the reaction mass, wherein at least a portion of the reaction mass extends beyond the end body section.

11. The actuator of claim 10, wherein the end body section seats flush against an interface surface formed as part of the actuator base.

12. The actuator of claim 10, further including:
an adjustable interfacing mechanism between the reaction mass support member and the actuator base for positioning the reaction mass within an allowable tolerance range by offsetting manufacturing tolerances of the spring structures.

13. The actuator of claim 12, wherein the adjustable interfacing mechanism comprises a plurality of spacers that together define the position of the reaction mass in six DOF, wherein a plurality of the spacers are associated with the reaction mass support member and a different plurality of spacers are associated with the actuator base.

14. The actuator of claim 13, wherein each spacer is an elongated member formed of a material that is grindable so that the spacer assumes a desired length, one end of the spacer being planar while the other end has a spherical shape.

15. The actuator of claim 10, wherein a space is formed between the end body section and the reaction mass to permit one or more conductive leads to be fed therethrough from an actuator coil assembly that is securely attached to one end of the reaction mass.

16. An actuator for positioning of optical elements like mirrors in an optical system comprising:
an actuator base;
a reaction mass assembly including a reaction mass support member having biasing features formed as a part thereof and a reaction mass that is coupled to the biasing features such that the reaction mass is suspended on the biasing features in six degrees of freedom (DOF),
wherein the support member is adapted to be fixedly connected to the actuator base, and
wherein each biasing feature is stiff along a length thereof but for forces perpendicular to the biasing feature, the biasing feature is weak.

17. An actuator for positioning of optical elements like mirrors in an optical system comprising:
an actuator base;
spring structures;
a reaction mass assembly including a reaction mass support member having biasing features formed as a part thereof and a reaction mass that is coupled to the biasing features such that the reaction mass is suspended on the biasing features in six degrees of freedom (DOF),
wherein the support member is adapted to be fixedly connected to the actuator base, and
wherein the reaction mass and spring structures are constructed and coupled to one another to function as a bi-directional low-pass filter and prevent transferal of disturbances generated by surroundings to the mirror and also prevent transferal of disturbances generated by the actuator to the surrounds and to any other actuators that a re present.

18. An actuator for positioning of optical elements like mirrors in an optical system comprising:
an actuator base;
a reaction mass assembly including a reaction mass support member having biasing features formed as a part thereof and a reaction mass that is coupled to the biasing features such that the reaction mass is suspended on the biasing features in six degrees of freedom (DOF),
wherein the support member is adapted to be fixedly connected to the actuator base, and
wherein the actuator includes an active part and a passive part that are free from a direct physical connection to one another, the active part of the actuator being directly connected to the reaction mass.

19. An actuator reaction mass assembly for decoupling disturbance forces and increasing control bandwidth comprising:
a reaction mass support member having a pair of opposing side walls that each has incorporated therein a spring structure that is formed of six spring elements that allow movement of the spring structure in six degrees of freedom; and
a reaction mass coupled to base sections of the spring structures such that the reaction mass is suspended on the six spring elements in six degrees of freedom (DOF).

20. The actuator reaction mass assembly of claim 19, wherein the reaction mass support member has an end body section that is defined in part by ends of the side walls and extends around an outer periphery of the reaction mass, wherein at least a portion of the reaction mass extends beyond the end body section.

21. The actuator reaction mass assembly of claim 19, wherein each of the spring structures has a base section that includes an opening for receiving a fastener that securely couples the reaction mass to the base sections such that movement of the reaction mass is translated into a force applied to the spring structures, whereby the spring elements act as filtering elements to ensure that the mirror remains in a desired location.

22. The actuator reaction mass assembly of claim 21, wherein each base section of the associated spring structure includes at least one opening formed therethrough to receive a member which prevents rotation of the reaction mass about the fastener that couples the reaction mass to one side wall.

23. The actuator reaction mass assembly of claim 19, wherein each side wall also includes an overload protection mechanism to protect the spring structures from an excessive deflection during an event by limiting a free stroke of the reaction mass by the overload protection mechanism.

24. The actuator reaction mass assembly of claim 23, wherein the overload protection mechanism includes an overload protection plate that is mounted to one of the side walls in a location below one respective spring structure.

25. The actuator reaction mass assembly of claim 19, wherein each spring structure is formed of four double hooked leaf springs that define the six spring elements and provides six weak spring directions.

26. The actuator reaction mass assembly of claim 19, further including:
an adjustable interfacing mechanism between the reaction mass support member and an actuator base for positioning the reaction mass within an allowable tolerance range by offsetting manufacturing tolerances of the spring structures.

27. The actuator reaction mass assembly of claim 26, wherein the adjustable interfacing mechanism comprises a plurality of spacers that together define the position of the reaction mass in six DOF, wherein a plurality of the spacers are associated with the reaction mass support member and a different plurality of spacers are associated with the actuator base.

28. An actuator reaction mass assembly for decoupling disturbance forces and increasing control bandwidth comprising:
a reaction mass support member having a pair of opposing side walls that each has incorporated therein a spring structure that is formed of at least one spring element that allows movement of the spring structure in at least one direction; and
a reaction mass coupled to base sections of the spring structures such that the reaction mass is suspended on the at least one spring element in at least one degree of freedom (DOF).

29. The actuator reaction mass assembly of claim 28, wherein each spring element has only one DOF and the spring structure includes two parallel leaf springs and the reaction mass only filters out forces in an actuation direction while all other parasitic forces are let through.

30. A method of decoupling disturbance forces and increasing control bandwidth in an actuator for an optical element like in a mirror actuator having an active part and a passive part, the method including the steps of:
providing a reaction mass support member having a pair of opposing side walls that each has incorporated therein a spring structure that is formed of six spring elements that allow movement of the spring structure in six directions;
coupling a reaction mass to base sections of the spring structures such that the reaction mass is suspended on the six spring elements in six degrees of freedom (DOF);
attaching the active part of the mirror actuator to the reaction mass; and
mounting the support member to a support base of the actuator, the support base carrying the passive part of the actuator such that when the support member is mounted to the support base, the passive and active parts have a proximate relationship but are free from direct physical connection, wherein the passive part of the actuator is in a connection relationship with the optical element like the mirror.

31. The method of claim 30, wherein the active part comprises a coil assembly and the passive part comprises a magnet core assembly with the coil at least being partially received within a housing of the coil assembly when the support member is mounted to the support base.

32. The method of claim 30, wherein coupling the reaction mass to base sections of the spring structures comprises the steps of:
forming openings through each of the base sections of the spring structures; and
inserting a fastener through each opening in the base section and into an opening formed in the reaction mass, whereby the reaction mass is directly attached to the base sections.

33. The method of claim 32, further including the step of:
preventing the rotation of the reaction mass about the fastener by inserting one or more pins through each of the base sections.

34. The method of claim 30, further including the step of:
positioning the reaction mass within an allowable tolerance range by offsetting manufacturing tolerances of the spring structures by providing an adjustable interfacing mechanism between the reaction mass support member and the actuator base.

35. The method of claim 34, wherein the adjustable interfacing mechanism comprises a plurality of spacers that together define the position of the reaction mass in six DOF, wherein a plurality of the spacers are associated with the reaction mass support member and a different plurality of spacers are associated with the actuator base.

36. The method of claim 30, further including the step of:
forming an overload protection mechanism on the spring structures to protect the spring structures from an excessive deflection during an event by limiting a free stroke of the reaction mass.

37. The method of claim 30, wherein the step of forming the overload protection mechanism comprises the step of:
mounting an overload protection plate to one of the side walls in a location below one respective spring structure.

38. The method of claim 30, wherein the reaction mass functions as a bi-directional low-pass filter and prevents transferal of disturbances generated by surroundings to the mirror and also prevents transferal of disturbances generated by the actuator to the surroundings and to any other actuators that are present.

39. The method of claim 30, wherein incorporating a spring structure in each side wall includes the step of:
forming four double hooked leaf springs within the side wall such the these springs define the six spring elements and provides six weak spring directions.

40. An actuator reaction mass assembly for decoupling disturbance forces and increasing control bandwidth comprising:
a reaction mass support member having biasing features formed as a part thereof, and
a reaction mass that is coupled to the biasing features such that the reaction mass is suspended relative to surroundings on the biasing features in more than two degrees of freedom (DOF), with each biasing feature being stiff along a length thereof but for forces perpendicular to that direction, the biasing feature is weak.

41. A precision positioning actuator, comprising an actuator base joint to a base, at least one movable part movable relative to the actuator base and associated to an element positioned by the actuator relative to the actuator base or the base, a quasi-stationary part separated from the actuator base and interaction with the movable part, a reaction mass associated to the quasi-stationary part, actuation means joined to the quasi-stationary part and/or the moveable part, at least one elastic bearing means with a first end and a second end, the first end joined to the actuator base and/or the base and the second end joined to the reaction mass and/or to the quasi-stationary part, wherein the elastic bearing means comprises a flexure system, the flexure system providing six degrees of freedom for said second end.

42. The precision actuator according to claim 41, wherein the elastic bearing means supports and/or suspends the quasi-stationary part by the flexure system.

43. The precision actuator according to claim 42, wherein the movable part and the quasi-stationary part are separated by a distance.

44. The precision actuator according to claim 42, wherein the flexure system comprises at least one elastic joint and at least two leaf springs extending from said elastic joint.

45. The precision actuator according to claim 44, wherein the elastic bearing comprises a monolithic part, comprising the flexure system with said elastic joint.

46. The precision actuator according to claim 44, wherein said at least two leaf-springs of said flexure system are arranged in a plane.

47. The precision actuator according to claim 44, wherein said at least two leaf-springs generate forces by elastic elongation to at least partially compensate the gravitational force of the quasi-stationary part and/or the reaction mass and/or the element.

* * * * *

UNITED STATES PATENT AND TRADEMARK OFFICE
CERTIFICATE OF CORRECTION

PATENT NO. : 7,885,021 B2
APPLICATION NO. : 12/057130
DATED : February 8, 2011
INVENTOR(S) : Frans H. van Deuren It is certified that error appears in the above-identified patent and that said Letters Patent is hereby corrected as shown below:

Column 4,
Line 8, Delete "filed" and insert --field.--

Column 4,
Line 57, Delete "apposite" and insert --opposite--

Column 7,
Line 29, Delete "Hermatically" and insert --"Hermetically--

Column 11,
Line 38, Delete "away" and insert --a way--

Column 14,
Line 3, Delete "a re" and insert --are--

Column 16,
Line 28, After "such" delete "the" and insert --that--

Signed and Sealed this
Twelfth Day of April, 2011

David J. Kappos
*Director of the United States Patent and Trademark Office*